United States Patent
Yamada et al.

(10) Patent No.: US 12,195,285 B2
(45) Date of Patent: Jan. 14, 2025

(54) SUBSTRATE HOLDING HAND AND SUBSTRATE TRANSFERRING ROBOT

(71) Applicant: Kawasaki Jukogyo Kabushiki Kaisha, Kobe (JP)

(72) Inventors: Satoshi Yamada, Kobe (JP); Ryunosuke Takauji, Kobe (JP); Ippei Shimizu, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 257 days.

(21) Appl. No.: 17/801,802

(22) PCT Filed: Feb. 25, 2021

(86) PCT No.: PCT/JP2021/006997
§ 371 (c)(1),
(2) Date: Aug. 24, 2022

(87) PCT Pub. No.: WO2021/172400
PCT Pub. Date: Sep. 2, 2021

(65) Prior Publication Data
US 2023/0116525 A1   Apr. 13, 2023

(30) Foreign Application Priority Data
Feb. 28, 2020 (JP) ................................. 2020-033815

(51) Int. Cl.
*H01L 21/687* (2006.01)
*B65G 47/90* (2006.01)
*H01L 21/67* (2006.01)

(52) U.S. Cl.
CPC ........ *B65G 47/90* (2013.01); *H01L 21/67259* (2013.01); *H01L 21/68707* (2013.01)

(58) Field of Classification Search
CPC .................................................. H01L 21/68707
See application file for complete search history.

(56) References Cited

U.S. PATENT DOCUMENTS

2008/0213076 A1 * 9/2008 Hanson ............. H01L 21/68707
414/744.1
2010/0290886 A1   11/2010 Hashimoto et al.
(Continued)

FOREIGN PATENT DOCUMENTS

JP       2002-134586 A     5/2002
JP       2003258076 A  *  9/2003
(Continued)

*Primary Examiner* — Gerald McClain
(74) *Attorney, Agent, or Firm* — XSENSUS LLP

(57) ABSTRACT

A substrate holding hand includes a supporting plate where a circular reference capture range is defined, a plurality of pads disposed within the reference capture range, at least one stationary stopper that is disposed along an outer circumferential circle of the reference capture range, at least one movable stopper having a part at the same height from the supporting plate as the stationary stopper, and a stopper actuator that moves the movable stopper from a retracted position outside the reference capture range to a deployed position closer to the stationary stopper than the retracted position. A circular reduced capture range is defined by the movable stopper at the deployed position, and the front stopper, and a diameter of the reduced capture range is larger than a diameter of the substrate and smaller than a diameter of the reference capture range.

20 Claims, 11 Drawing Sheets

(56) References Cited

U.S. PATENT DOCUMENTS

| | | | |
|---|---|---|---|
| 2011/0187140 A1 | 8/2011 | Hashimoto et al. | |
| 2013/0180448 A1* | 7/2013 | Sakaue | H01L 21/68707 |
| | | | 118/696 |
| 2019/0148210 A1* | 5/2019 | Shibata | B25J 15/0033 |
| | | | 294/103.1 |

FOREIGN PATENT DOCUMENTS

| | | |
|---|---|---|
| JP | 2005191464 A * | 7/2005 |
| JP | 2013-42112 A | 2/2013 |
| JP | 2017-175072 A | 9/2017 |
| JP | 2020-9819 A | 1/2020 |
| KR | 10-2014-0057400 A1 | 5/2014 |

* cited by examiner

SUBSTRATE HOLDING HAND AND SUBSTRATE TRANSFERRING ROBOT

CROSS-REFERENCE TO RELATED APPLICATIONS

The present application is based on PCT filing PCT/JP2021/006997, filed Feb. 25, 2021, which claims priority to JP 2020-033815, filed Feb. 28, 2020, the entire contents of each are incorporated herein by reference.

TECHNICAL FIELD

The present disclosure relates to a substrate holding hand for holding a substrate, such as a semiconductor wafer and a glass substrate, and a substrate transferring robot provided with the substrate holding hand.

BACKGROUND ART

Conventionally, it is known that substrate transferring robots convey a substrate, such as a semiconductor wafer and a glass substrate. Generally, the substrate transferring robot includes a manipulator and a substrate holding hand attached to a tip-end part of the manipulator. As the holding mode of the substrate of the substrate holding hand, a plurality of modes, such as a gripping mode, a sucking mode, and a placing mode, are known. Among these, the placing mode has advantages that it is simple in the structure and it can reduce an amount of particles generated from the substrate. Patent Document 1 discloses one example of the substrate holding hand of the placing mode.

FIG. 13 is a plan view of a conventional substrate holding hand 100 in the placing mode. The conventional substrate holding hand 100 in the placing mode illustrated in FIG. 13 includes a thin-plate shaped supporting plate 110 and a plurality of pads 120 disposed on the supporting plate 110 to distribute over the supporting plate 110. A circular capture range $R_0$ is defined in the supporting plate 110, and the plurality of pads 120 are placed along an outer circumferential circle $P_0$ of the capture range $R_0$. Each pad 120 has a pad which supports a substrate W, and the pad has a down slope as it goes to the center of the capture range $R_0$. Therefore, the substrate W supported by the plurality of pads 120 is regulated in a horizontal movement to the outer circumference side from the capture range $R_0$.

REFERENCE DOCUMENT(S) OF CONVENTIONAL ART

Patent Document

[Patent Document 1] JP2020-009819A

DESCRIPTION OF THE DISCLOSURE

Problem(s) to be Solved by the Disclosure

In the conventional substrate holding hand 100 in the placing mode, a diameter $\varphi P_0$ of the outer circumferential circle $P_0$ of the capture range $R_0$ is enough larger than a diameter $\varphi W$ of the substrate W. Therefore, when receiving the substrate W by the substrate holding hand 100, the substrate W can be accommodated within the capture range $R_0$, even if the center of the substrate W is not in agreement with the center of the capture range $R_0$ due to errors etc. However, since the capture range $R_0$ is enough larger than the substrate W, it is difficult to precisely position the substrate W with respect to the substrate holding hand 100.

The present disclosure is made in view of the situation described above, and one purpose thereof is to provide a substrate holding hand in a placing mode, and a substrate transferring robot provided with the substrate holding hand, capable of improving the accuracy of positioning of a substrate with respect to the substrate holding hand.

Means for Solving the Problem(s)

A substrate holding hand according to one aspect of the present disclosure includes a supporting plate where a circular reference capture range is defined, a plurality of pads disposed on the supporting plate within the reference capture range, at least one stationary stopper that is disposed along an outer circumferential circle of the reference capture range, and regulates movement of a substrate supported by the plurality of pads to an outer circumference side of the reference capture range, at least one movable stopper having a part at the same height from the supporting plate as the stationary stopper, and a stopper actuator that moves the movable stopper from a retracted position on or outside the outer circumferential circle of the reference capture range to a deployed position closer to the stationary stopper from the retracted position. A circular reduced capture range is defined by the movable stopper at the deployed position, and the stationary stopper, and a diameter of the reduced capture range is larger than a diameter of the substrate and smaller than a diameter of the reference capture range.

Further, a substrate transferring robot according to another aspect of the present disclosure includes an arm, and the substrate holding hand described above that is attached to a tip-end part of the arm.

In the substrate holding hand and the substrate transferring robot provided with the hand having these configurations, by deploying the movable stopper from the retracted position to the deployed position after the substrate is placed within the reference capture range, the placement range of the substrate (capture range) can be reduced to the reduced capture range.

By the placement range of the substrate being reduced to the reduced capture range, the position of the substrate on the hand is specified within the reduced capture range. That is, the existence range of the substrate on the hand is narrowed. Thus, although the holding mode of the substrate in the substrate holding hand with the configuration described above is the placing mode, the substrate can be positioned more exactly with respect to the hand. Therefore, the substrate is transferable from the hand to a transferring destination, such as a jig, with sufficient accuracy of position.

Further, although the substrate accommodated within the reduced capture range is supported by the plurality of pads, it is not gripped by the movable stopper and the stationary stopper. Thus, since the substrate is not gripped in the hand, it is avoided that contamination is caused by powder which is produced by friction between the hand and the substrate when the substrate is gripped.

Effect of the Disclosure

According to the present disclosure, in a substrate holding hand in a placing mode and a substrate transferring robot provided with the hand, the positioning accuracy of a substrate with respect to the substrate holding hand can be improved.

MODES FOR CARRYING OUT THE DISCLOSURE

Figure 1:
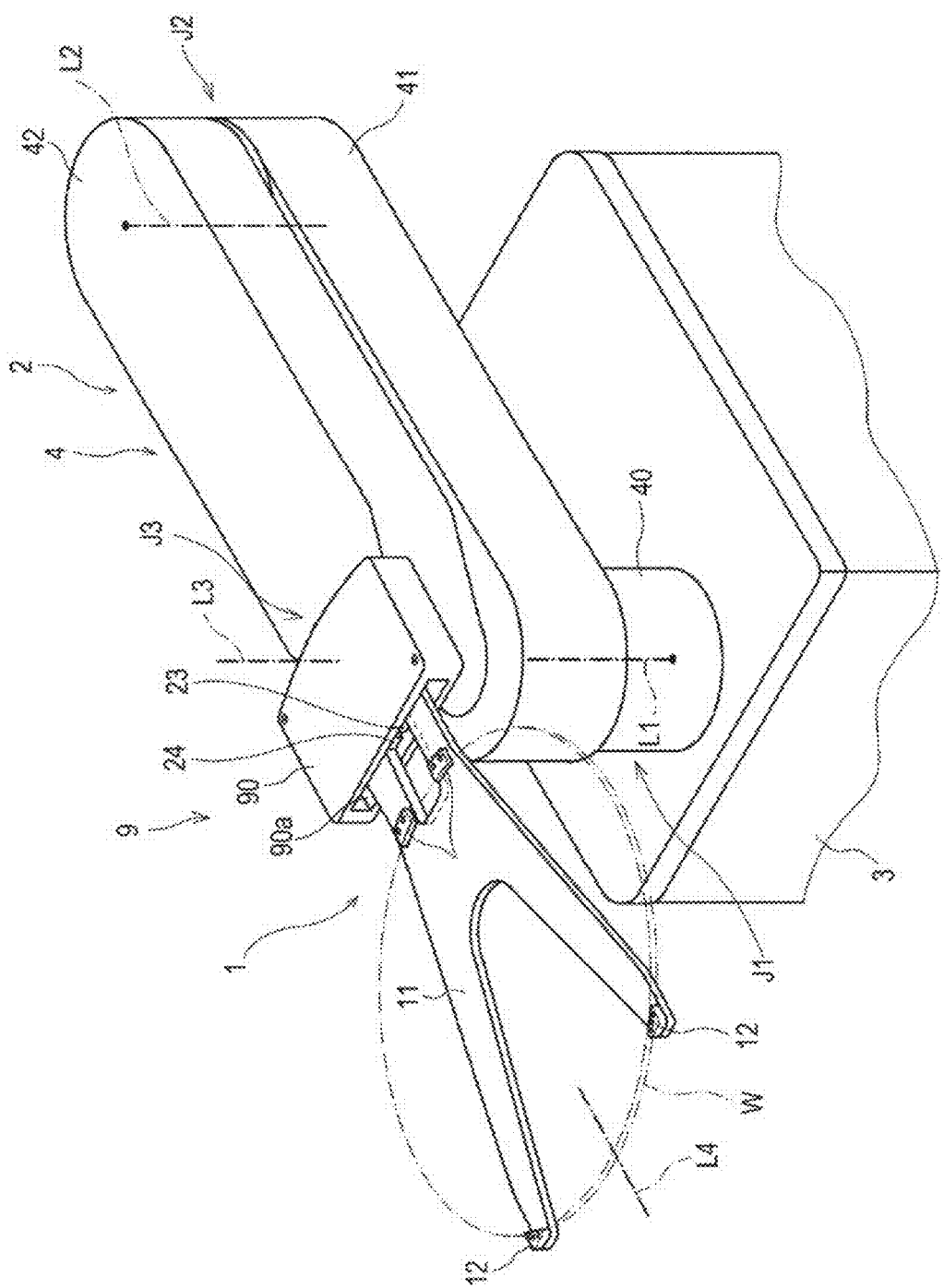
FIG. 1 is a perspective view illustrating a substrate transferring robot provided with a substrate holding hand according to one embodiment of the present disclosure.

Hereinafter, one embodiment of the present disclosure is described with reference to the drawings. FIG. 1 is a perspective view illustrating a substrate transferring robot 2 provided with a substrate holding hand according to one embodiment of the present disclosure (hereinafter, simply referred to as "the hand 1"). The substrate transferring robot 2 illustrated in FIG. 1 is a robot which transfers a substrate W, and, for example, it is provided to semiconductor processing equipment. The substrate W is a thin plate used in the semiconductor processing etc. The substrate includes, for example, a semiconductor wafer, a glass wafer, and a sapphire (single crystal alumina) wafer. The semiconductor wafer includes, for example, a silicon wafer, a wafer made only of semiconductor other than silicon, and a wafer made of compound semiconductor. The glass wafer includes, for example, a glass substrate for FPD (Flat Panel Display) and a glass substrate for MEMS (Micro Electro Mechanical Systems).

[Outline Configuration of Substrate Transferring Robot 2]

The substrate transferring robot 2 according to this embodiment includes a pedestal 3, an arm 4 supported by the pedestal 3, the hand 1 attached to a tip-end part of the arm 4, and a control device 8. Although the arm 4 according to this embodiment is a horizontal articulated robotic arm, the form of the arm 4 is not limited to this configuration.

The arm 4 includes a lifting shaft 40 provided to the pedestal 3, a first link 41, and a second link 42. A base-end part of the first link 41 is coupled to an upper end of the lifting shaft 40 via a first joint J1. A base-end part of the second link 42 is coupled to a tip-end part of the first link 41 via a second joint J2. A base-end part of the hand 1 is coupled to a tip-end part of the second link 42 via a wrist joint J3.

Figure 2:
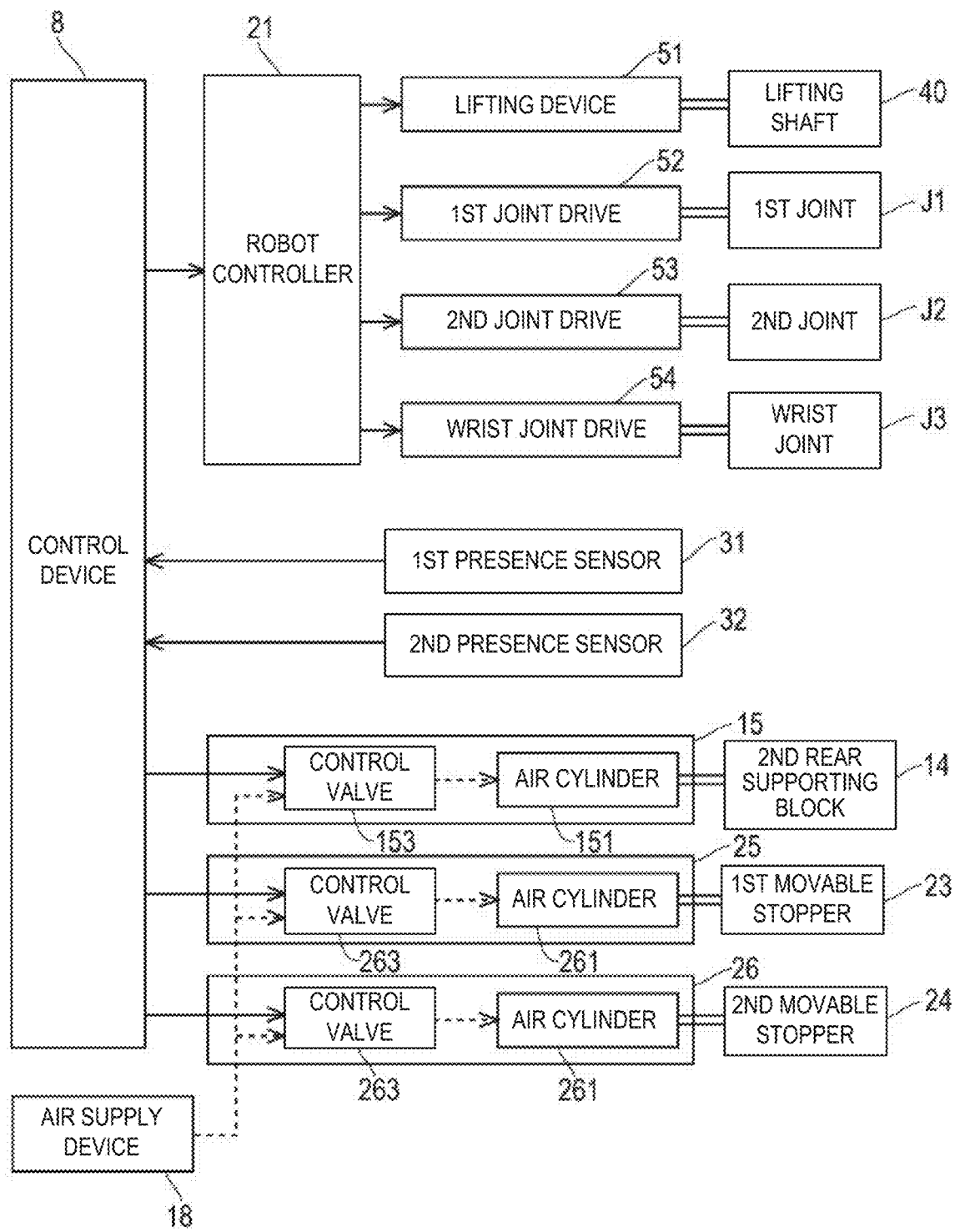
FIG. 2 is a view illustrating a configuration of a control system of the substrate transferring robot.

FIG. 2 is a view illustrating a configuration of a control system of the substrate transferring robot 2. As illustrated in FIGS. 1 and 2, the lifting shaft 40 is raised and lowered with respect to the pedestal 3 by a lifting device 51. The lifting device 51 includes, for example, a servomotor, a rotational position sensor which detects a rotational position of an output shaft of the servomotor, and a linear motion mechanism which is operated by the output of the servomotor. The first joint J1 couples the first link 41 to the lifting shaft 40 so as to rotatable centering on a vertical first axis L1. The first joint J1 is driven by a first joint drive 52. The first joint drive 52 includes, for example, a servomotor, a rotational position sensor which detects a rotational position of an output shaft of the servomotor, and a power transmission mechanism which transmits the output of the servomotor to the first joint J1. The second joint J2 couples the second link 42 to the first link 41 so as to be rotatable centering on a vertical second axis L2. The second joint J2 is driven by a second joint drive 53. The second joint drive 53 includes, for example, a servomotor, a rotational position sensor which detects a rotational position of an output shaft of the servomotor, and a power transmission mechanism which transmits the output of the servomotor to the second joint J2. The wrist joint J3 couples the hand 1 to the second link 42 so as to be rotatable centering on a third vertical axis L3. The wrist joint J3 is driven by a wrist joint drive 54. The wrist joint drive 54 includes, for example, a servomotor, a rotational position sensor which detects a rotational position of an output shaft of the servomotor, and a power transmission mechanism which transmits the output of the servomotor to the wrist joint J3.

[Configuration of Hand 1]

Figure 3:
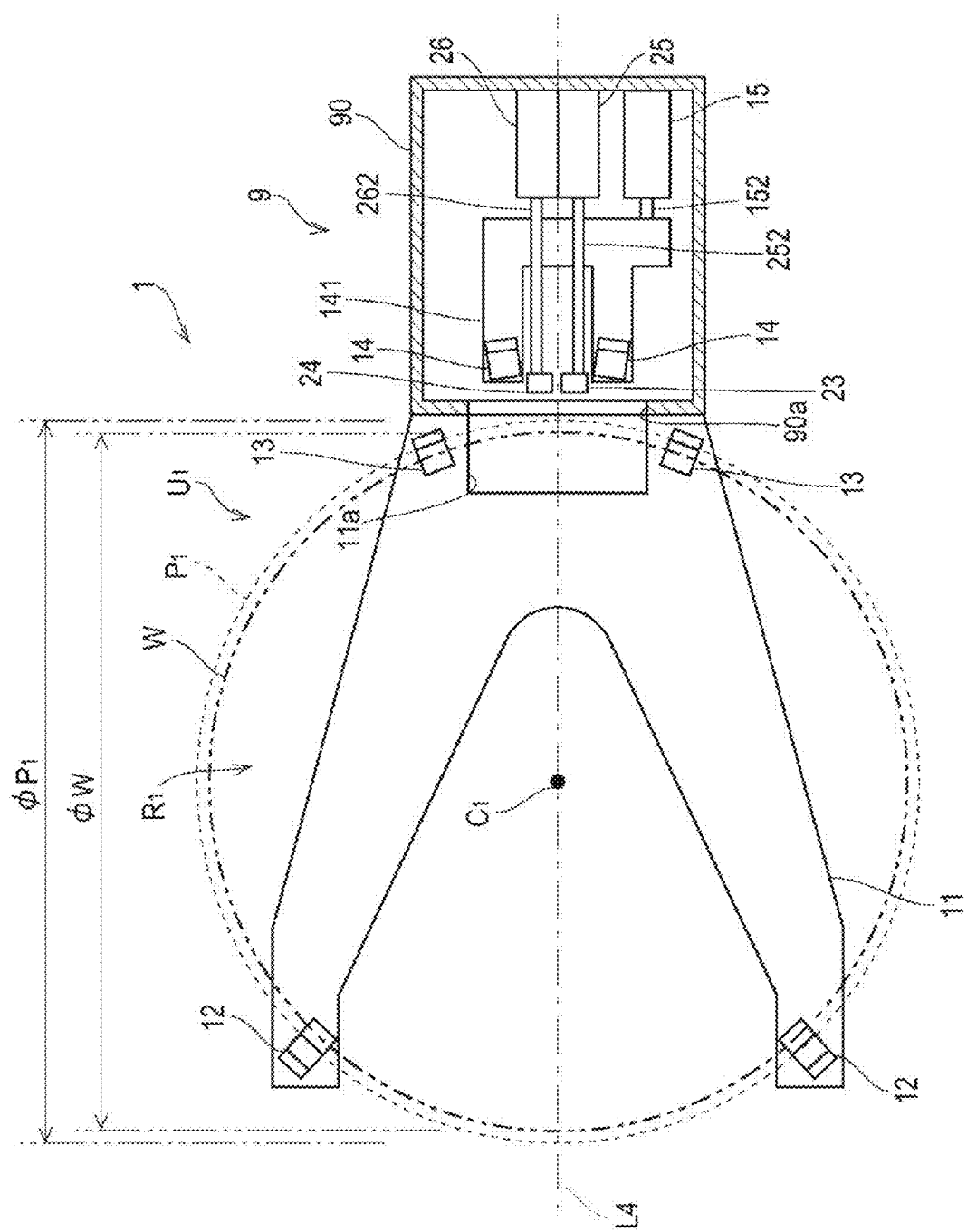
FIG. 3 is a plan view of the substrate holding hand.

FIG. 3 is a plan view of the hand 1. As illustrated in FIGS. 1 and 3, in the hand 1, a horizontal hand axis L4 which connects a base end of the hand 1 to a tip end is defined. The hand 1 includes a base part 9 which forms a base-end part, and a supporting plate 11 which forms a tip-end part. The base part 9 is provided with a casing 90 connected to the second link 42 via the wrist joint J3. The casing 90 has an opening 90a in a side surface which faces toward the tip end. A base-end part of the supporting plate 11 is fixed to the casing 90, and the supporting plate 11 projects from the opening 90a of the casing 90 toward the tip end of the hand.

The supporting plate 11 presents a thin-plate shape of which a tip-end side is branched into two. Note that the shape of the supporting plate 11 is not limited to this. The tip-end part of the supporting plate 11 is provided with at least a pair of front support blocks 12. In this embodiment, the pair of front support blocks 12 are disposed so as to be distributed to the respective two-branched tip-end parts of the supporting plate 11. Further, at least one first rear support block 13 is provided to the base-end part of the supporting plate 11. In this embodiment, a pair of first rear support blocks 13 are disposed at the base-end part of the supporting plate 11.

Inside the casing 90, a pair of second rear support blocks 14 are provided. The pair of second rear support blocks 14 are reciprocatable in parallel to the hand axis L4. The pair of second rear support blocks 14 are located inside the casing 90 in a state where they are retracted most. The pair of second rear support blocks 14 can deploy outside the casing 90 through the opening 90a, and are located forward of the opening 9a in a state where they are deployed most.

The pair of second rear support blocks 14 are attached to a support member 141. The support member 141 is a channel-shaped plate-like member of which a tip-end part is branched into two, and the second rear support blocks 14 are provided to the respective two-branched tip-end parts. The support member 141 is reciprocated by a block actuator 15 in parallel to the hand axis L4. The block actuator 15 according to this embodiment includes an air cylinder 151 and its control valve 153 (see FIG. 2). The support member 141 is connected to a cylinder rod 152 of the air cylinder 151.

In the plan view, a first movable stopper 23 and a second movable stopper 24 are provided between the pair of second rear support blocks 14 which are retracted into the casing 90. The first movable stopper 23 and the second movable stopper 24 have surfaces perpendicular to the principal surface of the supporting plate 11. The first movable stopper 23 and the second movable stopper 24 are reciprocatable in parallel to the hand axis L4. The first movable stopper 23 and the second movable stopper 24 are located inside the casing 90 in a state where they are retracted most. The first movable stopper 23 and the second movable stopper 24 can deploy outside the casing 90 through the opening 90a, and are located forward of the opening 9a in a state where they are deployed most.

The first movable stopper 23 is deployed and retracted (reciprocated) by a first stopper actuator 25 in parallel to the hand axis L4. The first stopper actuator 25 according to this embodiment includes an air cylinder 251 and its control valve 253 (see FIG. 2). The first movable stopper 23 is connected to a cylinder rod 252 of the air cylinder 251.

The second movable stopper 24 is reciprocated by a second stopper actuator 26 in parallel to the hand axis L4. The second stopper actuator 26 according to this embodiment includes an air cylinder 261 and its control valve 263 (see FIG. 2). The second movable stopper 24 is connected to a cylinder rod 262 of the air cylinder 261.

In order to avoid interference of the pair of second rear support blocks 14, the first movable stopper 23, and the second movable stopper 24 which are deployed forward from the opening 90a of the casing 90 with the supporting plate 11, an opening 11a is formed in the base-end part of the supporting plate 11.

Figure 4:
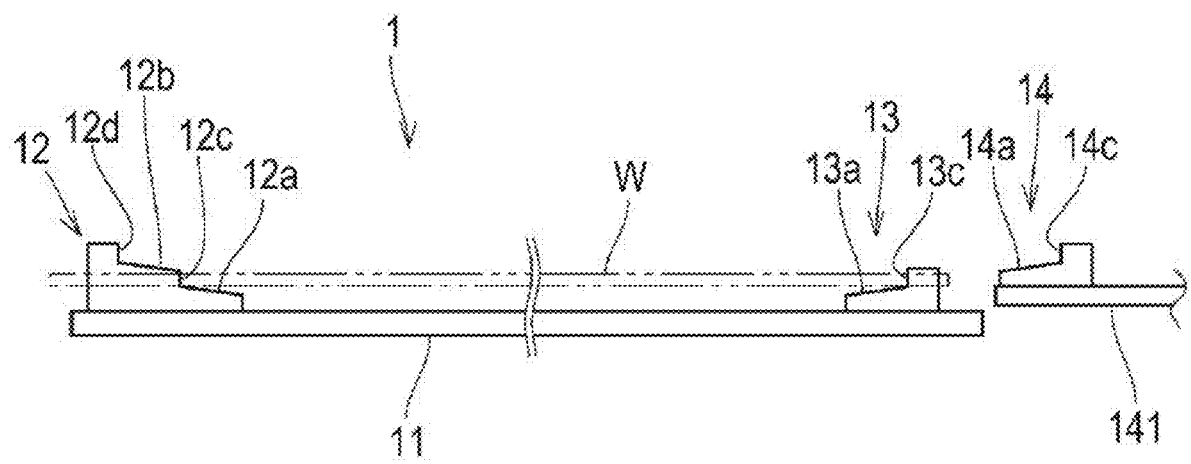
FIG. 4 is an outline side view of the substrate holding hand.

FIG. 4 is an outline side view of the hand 1. As illustrated in FIG. 4, the front support block 12 presents a stepped shape with at least three steps in a side view. In the front support block 12, a first front pad 12a is formed in a first step from the bottom, and a second front pad 12b is formed in an upper step of the first front pad 12a. Each of the first front pad 12a and the second front pad 12b has an upward surface which is used as a placement surface of the substrate W. The height of second front pad 12b from the supporting plate 11 is higher than the height of the first front pad 12a from the supporting plate 11. Note that the "height" from the supporting plate 11 is defined as a distance from a height reference surface in a direction perpendicular to the height reference surface, where the height reference surface is the principal surface of the supporting plate 11.

A first front stopper 12c is formed in a vertical surface between the first step and a second step from the bottom of the front support block 12. Further, a second front stopper 12d is formed in a vertical surface between the second step and a third step from the bottom of the front support block 12. In the front support block 12, the first front pad 12a, the first front stopper 12c, the second front pad 12b, and the second front stopper 12d are lined up toward the tip end of the hand in this order. Each of the first front stopper 12c and the second front stopper 12d has a surface perpendicular to the principal surface of the supporting plate 11. The first movable stopper 23 has a part having the same height as the pair of first front stoppers 12c from the supporting plate 11, and opposes to the pair of first front stoppers 12c having a first capture range $R_1$ (corresponding to a "first reference capture range" in the claims) therebetween. The second movable stopper 24 has a part having the same height as the pair of second front stoppers 12d from the supporting plate 11, and opposes to the pair of second front stoppers 12d having a second capture range $R_2$ (corresponding to a "second reference capture range" in the claims) therebetween. The pair of first front stoppers 12c and the pair of second front stoppers 12d are stationary stoppers of which a relative position with respect to the supporting plate 11 is fixed. Although the hand 1 according to this embodiment is provided with the pair of first front stoppers 12c, it may be provided with at least one first front stopper 12c. Similarly, although the hand 1 according to this embodiment is provided with the pair of second front stoppers 12d, it may be provided with at least one second front stopper 12d.

The first rear support block 13 presents a stepped shape with at least two steps in a side view. In the first rear support block 13, a first rear pad 13a is formed in a first step from the bottom. The first rear pad 13a has an upward surface which is used as a placement surface of the substrate W. A first rear stopper 13c is formed in a vertical surface between the first step and a second step from the bottom of the first rear support block 13. The first rear stopper 13c has a surface perpendicular to the principal surface of the supporting plate 11. The first rear stopper 13c is located on the base-end side of the hand 1 with respect to the first rear pad 13a.

The second rear support block 14 presents a stepped shape with at least two steps in a side view. In the second rear support block 14, a second rear pad 14a is formed in a first step from the bottom. The second rear pad 14a has an upward surface which is used as a placement surface of the substrate W. The height of the second rear pad 14a from the supporting plate 11 is higher than the height of the first rear pad 13a from the supporting plate 11. A second rear stopper 14c is formed in a vertical surface between the first step and a second step from the bottom of the second rear support block 14. The second rear stopper 14c has a surface perpendicular to the principal surface of the supporting plate 11. The second rear stopper 14c is located on the hand base-end side with respect to the second rear pad 14a.

As illustrated in FIG. 3, the circular first capture range $R_1$ centering on a given first supporting plate center $C_1$ is defined in the hand 1. A diameter $\varphi P_1$ of an outer circumferential circle $P_1$ of the first capture range $R_1$ is slightly (about several millimeters) larger than a diameter $\varphi W$ of the substrate W. Along the outer circumferential circle $P_1$ of the first capture range $R_1$, the pair of first front stoppers 12c and the pair of first rear stoppers 13c are disposed. The surfaces of these stoppers 12c and 13c face substantially toward the first supporting plate center $C_1$.

As illustrated in FIG. 4, the first step of a substrate supporting part is formed by the pair of first front pads 12a and the pair of first rear pads 13a. The pair of first front pads 12a and the pair of first rear pads 13a are located substantially at the same height from the supporting plate 11. At least one of the pair of first front pads 12a and the pair of first rear pads 13a may have a surface with a down slope toward the first supporting plate center $C_1$. Alternatively, at least one of the pair of first front pads 12a and the pair of first rear pads 13a may have a surface parallel to the principal surface of the supporting plate 11.

As illustrated in FIGS. 2 and 4, an edge (circumferential surface) of the substrate W placed on the first step of the substrate supporting part contacts or faces the pair of first front stoppers 12c and the pair of first rear stoppers 13c. The substrate W placed on the first step of the substrate supporting part is regulated by the pair of first front stoppers 12c in movement to the hand tip-end side, and is regulated by the pair of second front stoppers 12d in movement to the hand base-end side.

Figure 5:
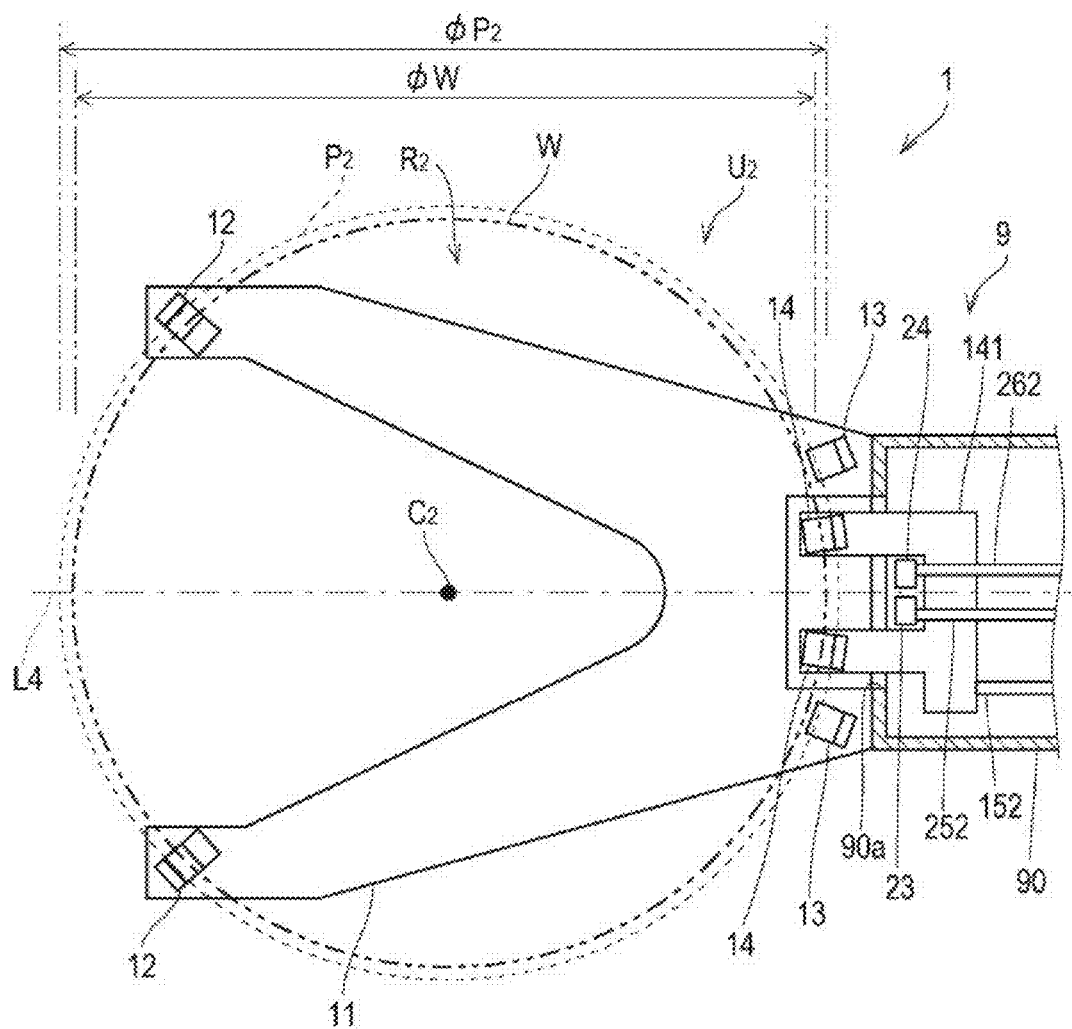
FIG. 5 is a plan view of the substrate holding hand, illustrating a situation in which a substrate is placed on a second step of a substrate supporting part.
Figure 6:
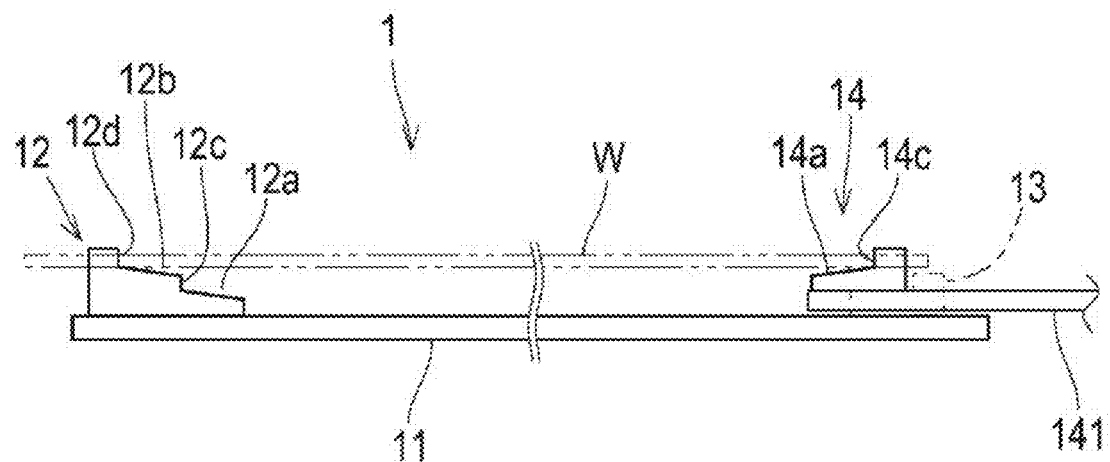
FIG. 6 is an outline side view of the substrate holding hand, illustrating a situation in which the substrate is placed on the second step of the substrate supporting part.

FIG. 5 is a plan view of the hand 1, illustrating a situation in which the substrate W is placed on the second step of the substrate supporting part, and FIG. 6 is an outline side view of the hand 1, illustrating a situation in which the substrate W is placed on the second step of the substrate supporting part. As illustrated in FIG. 5, the circular second capture range $R_2$ centering on a given second supporting plate center $C_2$ is defined in the hand 1. The second supporting plate center $C_2$ is located on the tip-end side of the hand from the first supporting plate center $C_1$, and the second capture range $R_2$ is located at a position which is shifted to the hand tip-end side from the first capture range $R_1$. A diameter $\varphi P_2$ of an outer circumferential circle $P_2$ of the second capture range $R_2$ is slightly (about several millimeters) larger than the diameter $\varphi W$ of the substrate W. The diameter $\varphi P_2$ of the second capture range $R_2$ may be the same as the diameter $\varphi P_1$ of the first capture range $R_1$.

Along the outer circumferential circle $P_2$ of the second capture range $R_2$, the pair of second front stoppers 12d, and the second rear stoppers 14c of the pair of second rear support blocks 14 located at the forward-moved positions are disposed. Each of the stoppers 12d and 14c has a surface which faces substantially toward the second supporting plate center $C_2$.

As illustrated in FIGS. 5 and 6, the second step of the substrate supporting part is formed by the pair of second front pads 12b, and the pair of second rear pads 14a at the forward-moved positions. The pair of second front pads 12b and the pair of second rear pads 14a are substantially at the same height from the supporting plate 11. At least one of the pair of second front pads 12b and the pair of second rear pads 14a may have a surface with a down slope toward the second supporting plate center $C_2$. Alternatively, at least one of the pair of second front pads 12b and the pair of second rear pads 14a may have a surface parallel to the principal surface of the supporting plate 11.

The edge of the substrate W placed on the second step of the substrate supporting part contacts or faces the pair of second front stoppers 12d and the pair of second rear stoppers 14c. The substrate W placed on the second step of the substrate supporting part is regulated by the pair of second front stoppers 12d in movement to the hand tip-end side, and is regulated by the pair of second rear pads 14a in movement to the hand base-end side.

[Control Device 8]

Figure 7:
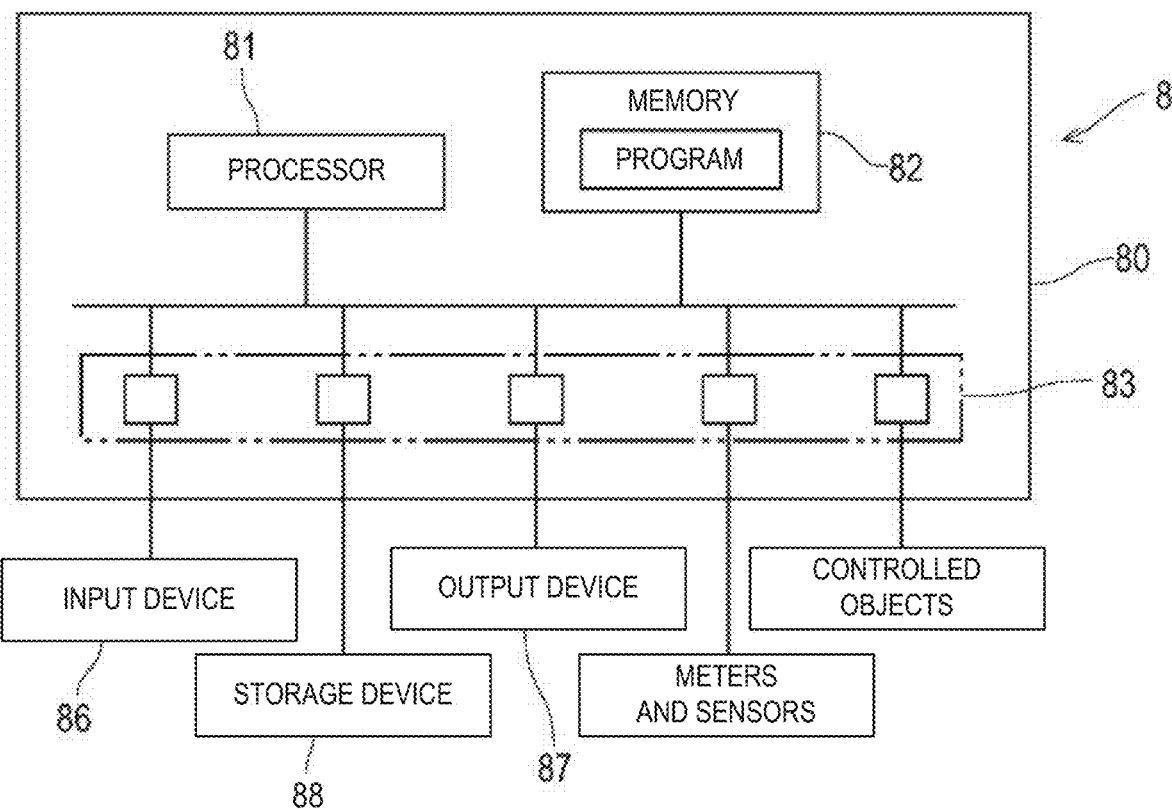
FIG. 7 is a block diagram illustrating an outline configuration of a control device.

FIG. 7 is a block diagram illustrating an outline configuration of the control device 8 (the control device 8 can also be referred to as control circuitry). The control device 8 of the substrate transferring robot 2 is provided with a computer 80. The computer 80 includes a processor 81, a memory 82 such as a ROM and a RAM, and an input/output part 83. The memory 82 stores a program to be executed by the processor 81. The program includes an operating program and an application program. By the processor 81 reading and executing the program, the control device 8 realizes a function configured in the program. The processor 81 is connected to an input device 86, an output device 87, a storage device 88, various kinds of meters and sensors, and controlled objects via the input/output part 83. The controlled objects according to this embodiment include a robot controller 21, and the control valves 153, 253, and 263. The input device 86 includes, for example, at least one of devices which accept an input to the control device 8, such as a keyboard, a mouse, and a touch panel. The output device 87 includes, for example, at least one of devices which output information from the control device 8, such as a display and a speaker. The storage device 88 may store various kinds of information required for processing by the control device 8.

The control device 8 controls the position and the posture of the hand 1 by operating the arm 4 of the substrate transferring robot 2. In more detail, as illustrated in FIG. 2, the control device 8 is connected to the robot controller 21, and the robot controller 21 is connected to the lifting device 51, the first joint drive 52, the second joint drive 53, and the wrist joint drive 54. The control device 8 calculates a current position and a current posture of the hand 1 based on detection values of the rotational position sensors included in the drives 51-54, calculates a target position and a target posture of the hand 1 based on teaching data stored beforehand, and transmits to the robot controller 21 a positional command so that the hand 1 becomes located at the target position and becomes in the target posture. The robot controller 21 controls operation of the drives 51-54 based on the positional command and the detection values of the rotational position sensors included in the drives 51-54. Thus, as the lifting shaft 40 and the joints J1-J3 of the arm 4 move, the hand 1 reaches the target position and the target posture.

The control device 8 is connected to the block actuator 15, the first stopper actuator 25, and the second stopper actuator 26, and controls operation of these actuators.

An air supply device 18, such as a compressor, is connected to the air cylinder 151 of the block actuator 15. Between the air supply device 18 and the air cylinder 151, the control valve 153 which is controlled by the control device 8 is provided. Further, by the control device 8 changing a flow rate and a direction of air which passes through the control valve 153, the cylinder rod 152 extends to deploy the pair of second rear support blocks 14, or the cylinder rod 152 shrinks to retract the pair of second rear support blocks 14.

The air supply device 18 is connected to the air cylinder 251 of the first stopper actuator 25. Between the air supply device 18 and the air cylinder 251, the control valve 253 which is controlled by the control device 8 is provided. Further, by the control device 8 changing a flow rate and a direction of air which passes through the control valve 253, the cylinder rod 252 extends to deploy the first movable stopper 23, or the cylinder rod 252 shrinks to retract the first movable stopper 23.

The air supply device 18 is connected to the air cylinder 261 of the second stopper actuator 26. Between the air supply device 18 and the air cylinder 261, the control valve 263 which is controlled by the control device 8 is provided. Further, by the control device 8 changing a flow rate and a direction of air which passes through the control valve 263, the cylinder rod 262 extends to deploy the second movable stopper 24, or the cylinder rod 262 shrinks to retract the second movable stopper 24.

The hand 1 is provided with a first presence sensor 31 and a second presence sensor 32. The first presence sensor 31 detects the existence of the substrate W on the first step of the substrate supporting part. The second presence sensor 32 detects the existence of the substrate W on the second step of the substrate supporting part. Note that the first presence sensor 31 and the second presence sensor 32 may be integrated into a single sensor. The first presence sensor 31 and the second presence sensor 32 are connected to the control device 8. The control device 8 acquires detection signals of the first presence sensor 31 and the second presence sensor 32 to detect the existence of the substrate W in the substrate supporting part.

[Method of Controlling Hand 1]

Operation of the hand 1 in the substrate transferring robot 2 having the configuration described above is described. Note that the movement of the hand 1 which is described below is realized by the operation of the drives 51-54 of the lifting shaft 40 and the joints J1-J3 of the arm 4 which receive the control of the control device 8. Further, operation of the pair of second rear support blocks 14 which is described below is realized by the operation of the block actuator 15 which receives the control of the control device 8, and operation of the first movable stopper 23 is realized by the operation of the first stopper actuator 25 which receives the control of the control device 8, and operation of the second movable stopper 24 is realized by the operation of the second stopper actuator 26 which receives the control of the control device 8.

Figure 8:
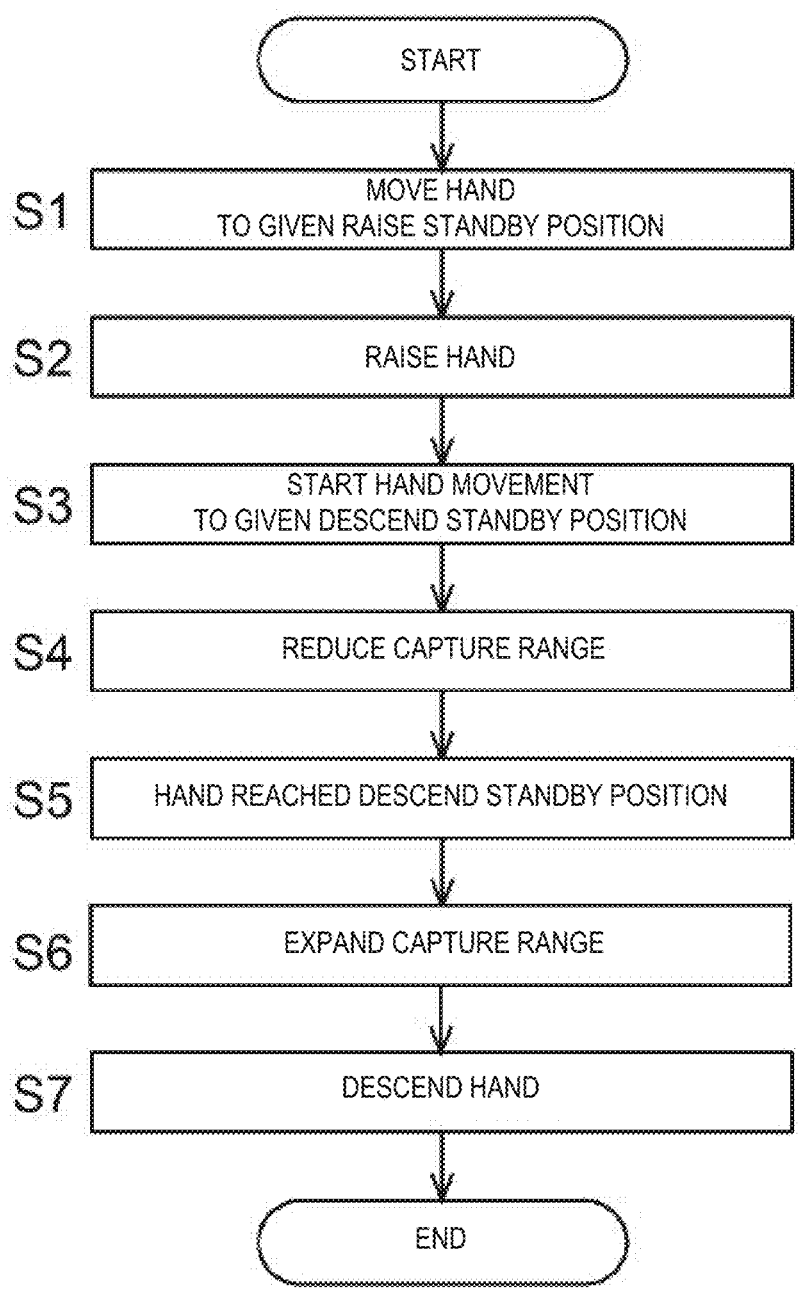
FIG. 8 is a flowchart of processing when transferring the substrate.

Below, referring to FIG. 8, operation of the hand 1, when it transfers the substrate W held by a first jig (not illustrated) to a second jig (not illustrated) located at a position distant from the first jig, is illustrated. FIG. 8 is a flowchart of processing for transferring the substrate W.

First Example

In Example 1, a first step support unit $U_1$, which includes a combination of a plurality of pads 12a and 13a which form the first step of the substrate supporting part, the front stopper 12c, the movable stopper 23, and the stopper actuator 25, is used. First, the hand 1 moves to a given raise standby position (Step S1). In the hand 1 at the raise standby position, the supporting plate 11 is located immediately below the substrate W held by the first jig, and the substrate W is accommodated within the first capture range $R_1$ in the plan view.

Next, the hand 1 moves to a raised position which is above the raise standby position by a given amount (Step S2). Therefore, the substrate W is transferred from the first jig to the hand 1. The substrate W is supported by the first step of the substrate supporting part (i.e., the pair of first front pads 12a and the pair of first rear pads 13a).

When the presence of the substrate W on the first step of the substrate supporting part is confirmed by the first presence sensor 31, the hand 1 starts movement from the raised position to a given descend standby position (Step S3). By the first movable stopper 23 deploys from a given retracted position to a given deployed position at a given timing during the movement of the hand 1, the placement range of the substrate W (capture range) is reduced (Step S4). The retracted position of the first movable stopper 23 is not limited to the retracted position inside the casing 90, but it may be on the circumference of the outer circumferential circle $P_1$ of the first capture range $R_1$ (it is not inside the first capture range $R_1$), or may be outside the first capture range $R_1$.

Figure 9:
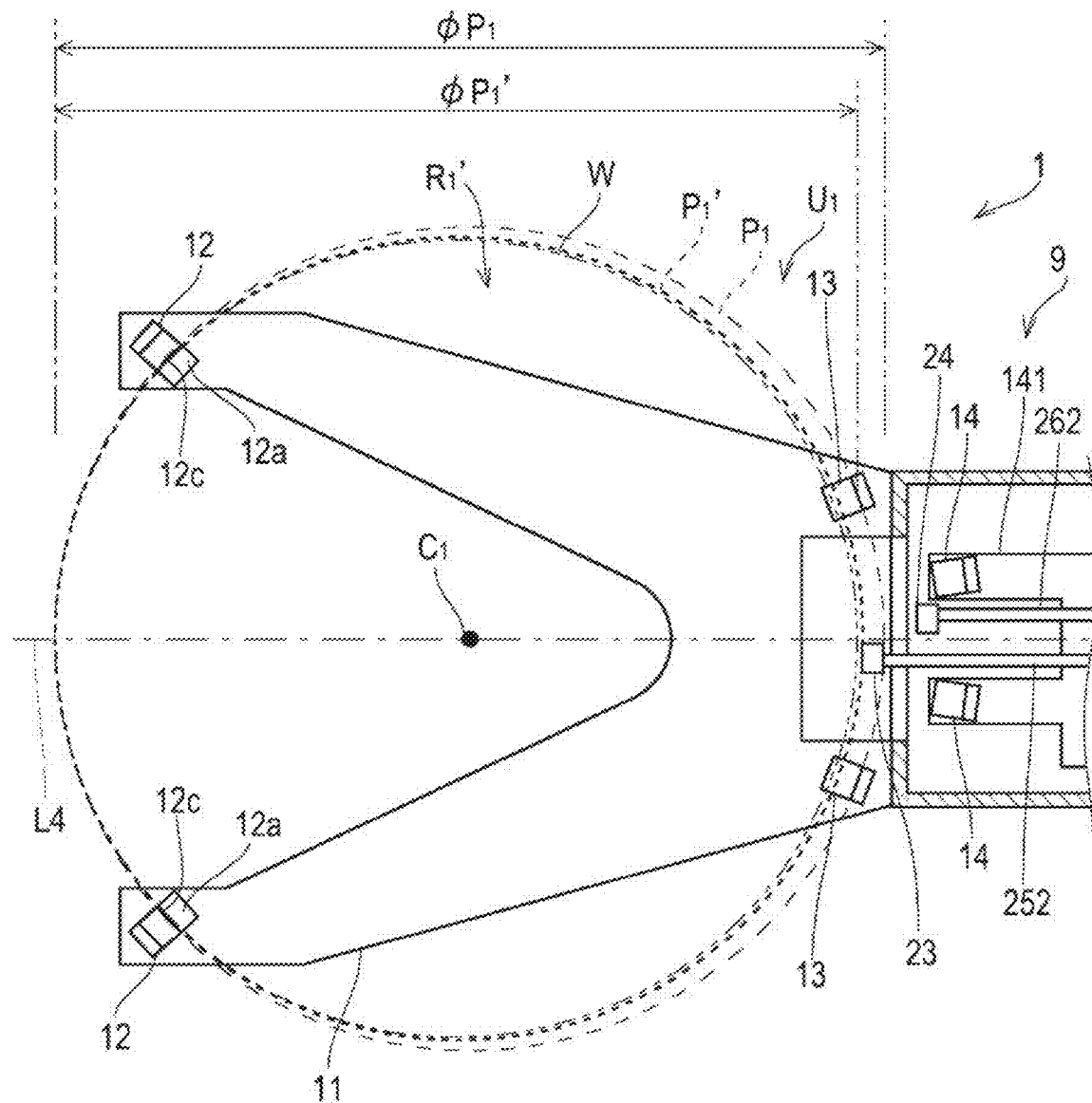
FIG. 9 is a plan view of the substrate holding hand, illustrating a situation in which a first capture range is reduced.

FIG. 9 is a plan view of the hand 1, illustrating a reduced first capture range $R_1'$. As illustrated in FIG. 9, the first movable stopper 23 located at the deployed position is located at least partially inside the outer circumferential circle $P_1$ of the first capture range $R_1$. The circular reduced first capture range $R_1'$ is defined by the first movable stopper 23 at the deployed position, and the pair of first front stoppers 12c. Note that, although the first movable stopper 23 may contact the edge of the substrate W in the process of deploying the first movable stopper 23, in this case, the substrate W moves toward the hand tip end while maintaining the state where it is supported by the pair of first front pads 12a and the pair of first rear pads 13a.

A diameter $\varphi P_1'$ of an outer circumferential circle $P_1'$ of the reduced first capture range $R_1'$ is larger than the diameter $\varphi W$ of the substrate W and smaller than the diameter $\varphi P_1$ of the outer circumferential circle $P_1$ of the first capture range $R_1$ ({the diameter $\varphi W$ of the substrate $W$}<$\varphi P_1'$<$\varphi P_1$). Therefore, although the substrate W accommodated within the reduced first capture range $R_1'$ is supported by the first step of the substrate supporting part, it is not gripped by the first movable stopper 23 and the pair of first front stoppers 12c.

The diameter $\varphi P_1$ of the outer circumferential circle $P_1$ and the diameter $\varphi P_1'$ of the outer circumferential circle $P_1'$ are determined according to the diameter $\varphi W$ of the substrate W. It is known that there are plural kinds of diameters $\varphi W$ of the substrate W. For example, when the diameter $\varphi W$ of the substrate W is 300 mm, the diameter $\varphi P_1$ of the outer circumferential circle $P_1$ of the first capture range $R_1$ may be 304 mm, and the diameter $\varphi P_1'$ of the outer circumferential circle $P_1'$ of the reduced first capture range $R_1'$ may be 301 mm. In this case, the diameter $\varphi P_1'$ may be a value larger than 300 mm and less than 304 mm, but, in terms of improving the positioning accuracy of the substrate W with respect to the hand 1, the diameter $\varphi P_1'$ is desirable to be a small value. On the other hand, if the diameter $\varphi P_1'$ is a value remarkably close to the diameter $\varphi W$ of the substrate W, the substrate W may be gripped by the first movable stopper 23 and the pair of first front stoppers 12c. Thus, the diameter $\varphi P_1'$ is determined in consideration of the dimensional error of the substrate W and the stroke error of the first movable stopper 23.

Although at Step S2 the substrate W received by the first step of the substrate supporting part is located within the first capture range $R_1$, the exact position of the substrate W with respect to the hand 1 is not specified. As the capture range is reduced to the reduced first capture range $R_1'$ by deploying the first movable stopper 23 at Step S4, the existence range of the substrate W on the hand 1 is narrowed. Therefore, the position of the substrate W on the hand 1 is specified within the reduced first capture range $R_1'$. That is, the substrate W is more exactly positioned with respect to the hand 1.

When the hand 1 reaches the descend standby position (Step S5), the first movable stopper 23 retracts to the retracted position to expand the capture range to the first capture range $R_1$ (Step S6).

In the hand 1 at the descend standby position, the supporting plate 11 is located immediately above the second jig, and the substrate W and the holding position of the second jig correspond to each other in the plan view. The hand 1 descends to the lowered position which is located below the descend standby position by a given amount (Step S7). Therefore, the substrate W is transferred from the hand 1 to the second jig.

At Step S6, even if the capture range is expanded, the position of the substrate W on the hand 1 is maintained. Thus, the substrate W is transferred from the hand 1 to the second jig in a state where it is more exactly positioned with respect to the hand 1. Therefore, the substrate W is transferred with the high accuracy of position with respect to the second jig.

Second Example

In the second example, a second step support unit $U_2$, which includes a combination of the plurality of pads 12b and 14a which form the second step of the substrate supporting part, the front stopper 12d, the movable stopper 24, and the stopper actuator 26, is used. The first step and the second step of the substrate supporting part of the hand 1 may be selectively used according to the cleanliness of the substrate W to be held. For example, a substrate W with high cleanliness is held using the second step of the substrate supporting part, and a polluted substrate W is held using the first step of the substrate supporting part.

In order to prepare the second capture range $R_2$ and the second step of the substrate supporting part for the hand 1, the second rear support block 14 is deployed to a given deployed position beforehand. First, the hand 1 moves to a given raise standby position (Step S1). In the hand 1 at the raise standby position, the supporting plate 11 is located immediately below the substrate W held by the first jig, and the substrate W is accommodated within the second capture range $R_2$ in the plan view.

Next, the hand 1 moves to the raised position which is located above the raise standby position by a given amount (Step S2). Therefore, the substrate W is transferred from the first jig to the hand 1. The substrate W is supported by the second step of the substrate supporting part (i.e., the pair of second front pads 12b and the pair of second rear pads 14a).

When the presence of the substrate W on the second step of the substrate supporting part is confirmed by the second presence sensor 32, the hand 1 starts moving from the raised position to a given descend standby position (Step S3). As the second movable stopper 24 deploys from the retracted position to the given deployed position at a given timing during the movement of the hand 1, the capture range is reduced to a reduced second capture range $R_2'$ (Step S4).

Figure 10:
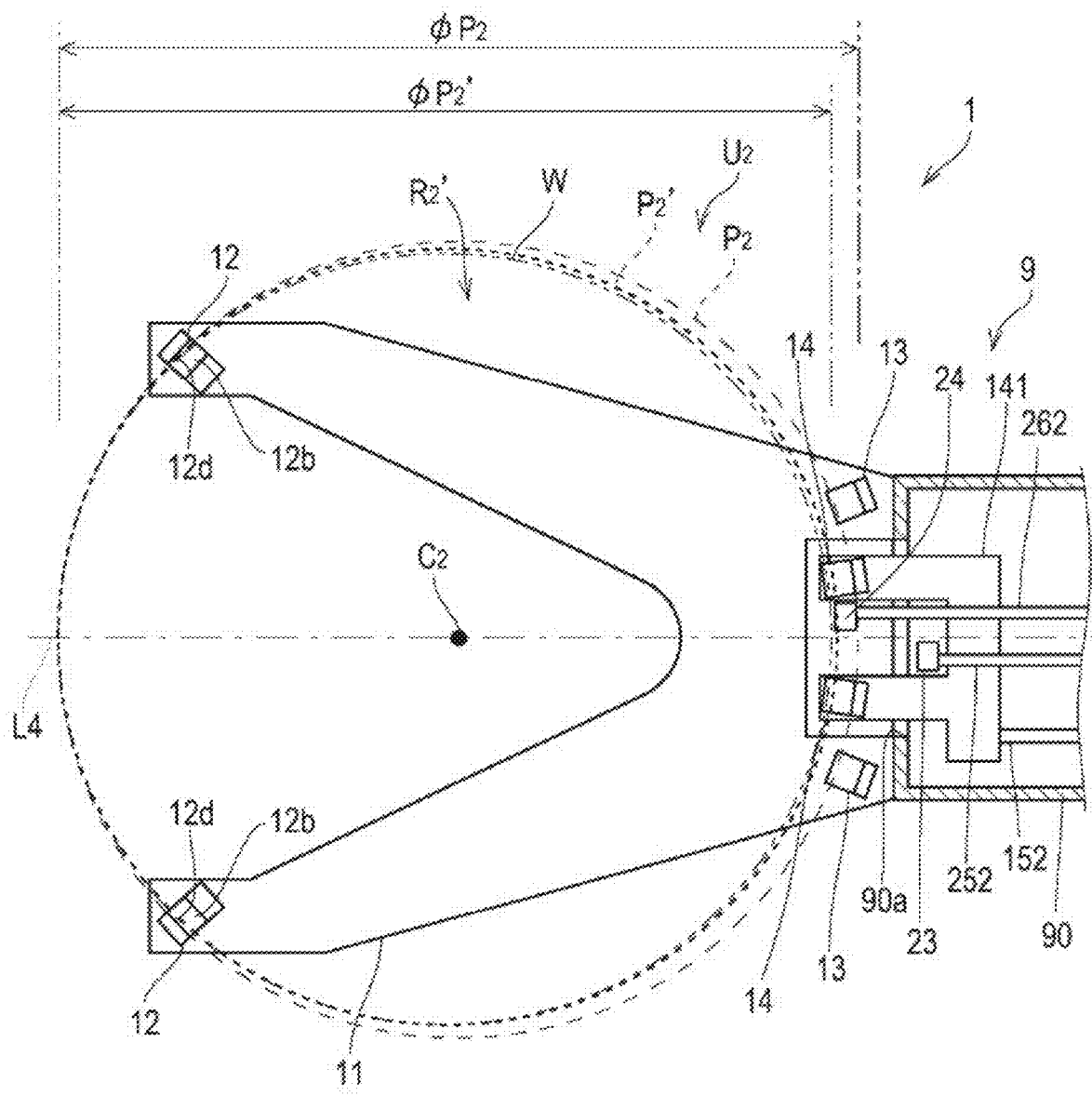
FIG. 10 is a plan view of the substrate holding hand, illustrating a situation in which a second capture range is reduced.

FIG. 10 is a plan view of the hand 1, illustrating the reduced second capture range $R_2'$. As illustrated in FIG. 10, the second movable stopper 24 at the deployed position is located at least partially inside the outer circumferential circle $P_2$ of the second capture range $R_2$. The reduced second capture range $R_2'$ is defined by the second movable stopper 24 at the deployed position, and the pair of second front stoppers 12d. Although the second movable stopper 24 may contact the edge of the substrate W in the process of deploying the second movable stopper 24, in this case, the substrate W moves toward the hand tip end (i.e., toward the pair of second front stoppers 12d), while maintaining the state where it is supported by the pair of second front pads 12b and the pair of second rear pads 14a.

A diameter $\varphi P_2'$ of an outer circumferential circle $P_2'$ of the reduced second capture range $R_2'$ is larger than the diameter $\varphi W$ of the substrate W and smaller than the diameter $\varphi P_2$ of the outer circumferential circle $P_2$ of the second capture range $R_2$ ({the diameter $\varphi W$ of the substrate $W$}<$\varphi P_2'$<$\varphi P_2$).

When the hand 1 reaches the descend standby position (Step S5), the second movable stopper 24 retracts to the retracted position inside the casing 90 to expand the capture range to the second capture range $R_2$ (Step S6).

In the hand 1 at the descend standby position, the supporting plate 11 is located immediately above the second jig, and the substrate W and the holding position of the second jig correspond to each other in the plan view. The hand 1 descends to the lowered position which is located below the descend standby position by a given amount (Step S7). Therefore, the substrate W is transferred from the hand 1 to the second jig.

Note that, among the transfer processing of the substrate W according to Examples 1 and 2, Step S6 (expansion of the capture range) may be skipped. However, when the capture range is expanded when the substrate W is transferred from the hand 1 to the jig (or vice versa), the possibility of the substrate W being scratched by the stoppers 12c, 13c, and 14c and the movable stoppers 23 and 24 decreases.

Further, among the transfer processing of the substrate W according to Examples 1 and 2, Step S4 (reduction of the capture range) may be performed at a timing before starting the movement toward the descend standby position after the substrate W is transferred to the hand 1, or before the capture range is expanded after the hand 1 reaches the descend standby position. Note that, when the capture range is reduced, it can be suppressed that the substrate W moves or vibrates on the hand 1 during the movement of the hand 1, and thus, it is desirable to perform the reduction of the capture range at a comparatively early timing after the substrate W is transferred to the hand 1.

As described above, the substrate transferring robot 2 according to this embodiment includes the arm 4, and the hand 1 attached to the tip-end part of the arm 4.

Further, the hand 1 according to this embodiment includes the supporting plate 11 where the circular reference capture range ($R_1$; $R_2$) is defined, the plurality of pads (12a, 13a; 12b) disposed on the supporting plate 11 within the reference capture range ($R_1$; $R_2$), the at least one stationary stopper (12c; 12d) which is disposed along the outer circumferential circle ($P_1$; $P_2$) of the reference capture range ($R_1$; $R_2$) and regulates the movement of the substrate W supported by the plurality of pads (12a, 12b; 12b) to the outer circumference side of the reference capture range ($R_1$; $R_2$), the at least one movable stopper (23; 24) which has the part at the same height as the stationary stopper (12c; 12d) from the supporting plate 11, and the stopper actuator (25; 26) configured to move the movable stopper (23; 24) from the retracted position on or outside the outer circumferential circle ($P_1$; $P_2$) of the reference capture range ($R_1$; $R_2$) to the deployed position closer to the stationary stopper (12c; 12d) from the retracted position. The circular reduced capture range ($R_1'$; $R_2'$) is defined by the movable stopper (23; 24) at the deployed position, and the stationary stopper (12c; 12d). The diameter ($\varphi R_1'$; $\varphi R_2'$) of the reduced capture range ($R_1'$; $R_2'$) is larger than the diameter $\varphi W$ of the substrate W and smaller than the diameter ($\varphi R_1$; $\varphi R_2$) of the reference capture range ($R_1$; $R_2$).

Note that, in the hand 1 according to this embodiment, although the stationary stoppers 12c and 12d are provided to the tip-end part of the supporting plate 11, it is not limited to this configuration, as long as the stationary stoppers 12c and 12d are disposed along the outer circumferential circles $P_1$ and $P_2$ of the reference capture ranges $R_1$ and $R_2$. The movable stoppers 23 and 24 are disposed according to the positions of the stationary stoppers 12c and 12d so as to face the stationary stoppers 12c and 12d having the substrate W therebetween. Further, although in the hand 1 according to this embodiment the plurality of pads 12a, 12b, and 12b have the flat upward surfaces, the plurality of pads 12a, 12b, and 12b may be projections which point-contact or line-contact the substrate W.

Further, the hand 1 according to this embodiment is further provided with the control device 8 which controls the stopper actuator (25; 26). The control device 8 operates the stopper actuator (25; 26) so that the movable stopper (23;

24) is moved from the retracted position to the deployed position at a given timing after the substrate W is placed on the plurality of pads (12a, 12b; 12b). Here, the hand 1 may be further provided with the sensor (31; 32) which detects the existence of the substrate W placed on the plurality of pads (12a, 12b; 12b). In this case, the control device 8 operates the stopper actuator (25; 26) so that the movable stopper (23; 24) is moved from the retracted position to the deployed position at the given timing after the sensor (31; 32) detects that the substrate W is placed on the plurality of pads (12a, 12b; 12b).

In the hand 1 having the configuration described above, and the substrate transferring robot 2 provided with the hand 1, by deploying the movable stopper (23; 24) from the retracted position to the deployed position after the substrate W is placed within the reference capture range ($R_1$; $R_2$), the placement range of the substrate can be reduced to the reduced capture range ($R_1'$; $R_2'$).

By reducing the placement range of the substrate to the reduced capture range ($R_1'$; $R_2'$), the position of the substrate W on the hand 1 is specified within the reduced capture range ($R_1'$; $R_2'$). That is, the existence range of the substrate W on the hand 1 is narrowed. Thus, although the holding mode of the substrate W in the hand 1 according to this embodiment is the placing mode, the substrate W can be positioned more exactly with respect to the hand 1. Therefore, the substrate W is transferable from the hand 1 to a transferring destination, such as a jig, with sufficient accuracy of position.

Although the substrate W accommodated within the reduced capture range ($R_1'$; $R_2'$) is placed on the plurality of pads (12a, 12b; 12b), it is not gripped by the movable stopper (23; 24) and the stationary stopper (12c; 12d). Thus, since the substrate W is not gripped in the hand 1, it is avoided that contamination is caused by powder which is produced by friction between the hand 1 and the substrate W when the substrate W is gripped.

The hand 1 according to this embodiment is provided with at least one rear stopper 13c which is disposed in the base-end part of the supporting plate 11, along the outer circumferential circle $P_1$ of the reference capture range $R_1$, and regulates the movement of the substrate W supported by the plurality of pads 12a and 13a to the hand base-end side. The hand 1 according to this embodiment is further provided with the rear pad 13a provided to the hand tip-end side of the rear stopper 13c. Although the rear stopper 13c is not essential, it adds such an advantage that the substrate W placed in the reference capture range $R_1$ is guided by the rear stopper 13c, and the movement of the substrate W located within the reference capture range $R_1$ to the hand base-end side is regulated.

In the hand 1 according to this embodiment, the plurality of reference capture ranges comprised of the first reference capture range $R_1$, and the second reference capture range $R_2$ which is shifted from the first reference capture range $R_1$ to the hand tip-end side are defined in the supporting plate 11. As for the first reference capture range $R_1$, the first step support unit $U_1$, which includes the combination of the plurality of pads 12a and 13a, the stationary stopper 12c, the movable stopper 23, and the stopper actuator 25, is provided. Similarly, for the second reference capture range $R_2$, the second step support unit $U_2$, which includes the combination of the plurality of pads 12b and 14a, the stationary stopper 12d, the movable stopper 24, and the stopper actuator 26, is provided. The second step support unit $U_2$ supports the substrate W at the higher position from the supporting plate 11 than the first step support unit $U_1$.

Thus, since the two steps of support units $U_1$ and $U_2$ are provided to the single hand 1, the two steps of support units $U_1$, and $U_2$ can selectively be used according to the cleanliness of the substrate W to be held.

Although the suitable embodiment of the present disclosure is described, those changed in the details of the concrete structures and/or functions of the above embodiment may be encompassed within the present disclosure, without departing from the spirit of the present disclosure. The above configuration may be modified as follows, for example.

(Modification 1)

Figure 11:
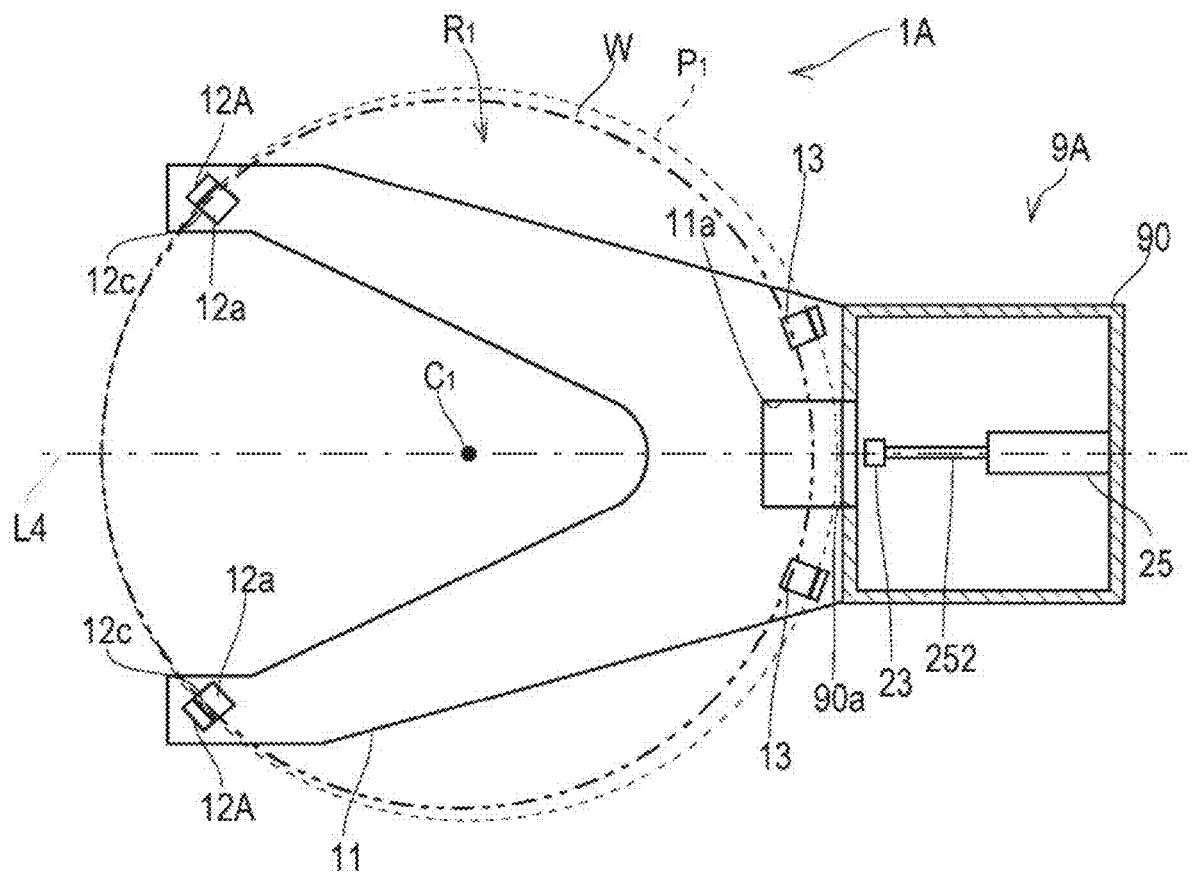
FIG. 11 is a plan view of a substrate holding hand according to Modification 1.

For example, although the hand 1 according to the above embodiment has the multi-step substrate supporting part, the substrate supporting part may be of a single step type. FIG. 11 is a plan view of a substrate holding hand 1A according to Modification 1. Note that, in the description of Modification 1, the same reference characters are assigned in the drawing to the members identical or similar to the above embodiment to omit description thereof. In the hand 1A illustrated in FIG. 11, the second rear support block 14, its actuator 15, the second movable stopper 24, the stopper actuator 26, etc., which constitute the second step support unit $U_2$ are omitted from the hand 1 according to the above embodiment. Further, in a front block 12A, the second front pad 12b and the second front stopper 12d are omitted, but the front block 12A has the first front pad 12a and the first front stopper 12c. In other words, the hand 1A according to Modification 1 includes the supporting plate 11, the plurality of pads 12a and 13a disposed on the supporting plate 11, the pair of front stoppers 12c provided to the tip-end part of the supporting plate 11, the movable stopper 23, and the stopper actuator 25 which drives the movable stopper 23. Since operations of the hand 1A according to Modification 1 and the substrate transferring robot 2 provided with the hand 1A are the same as those in Example 1, description thereof is omitted.

(Modification 2)

Figure 12:
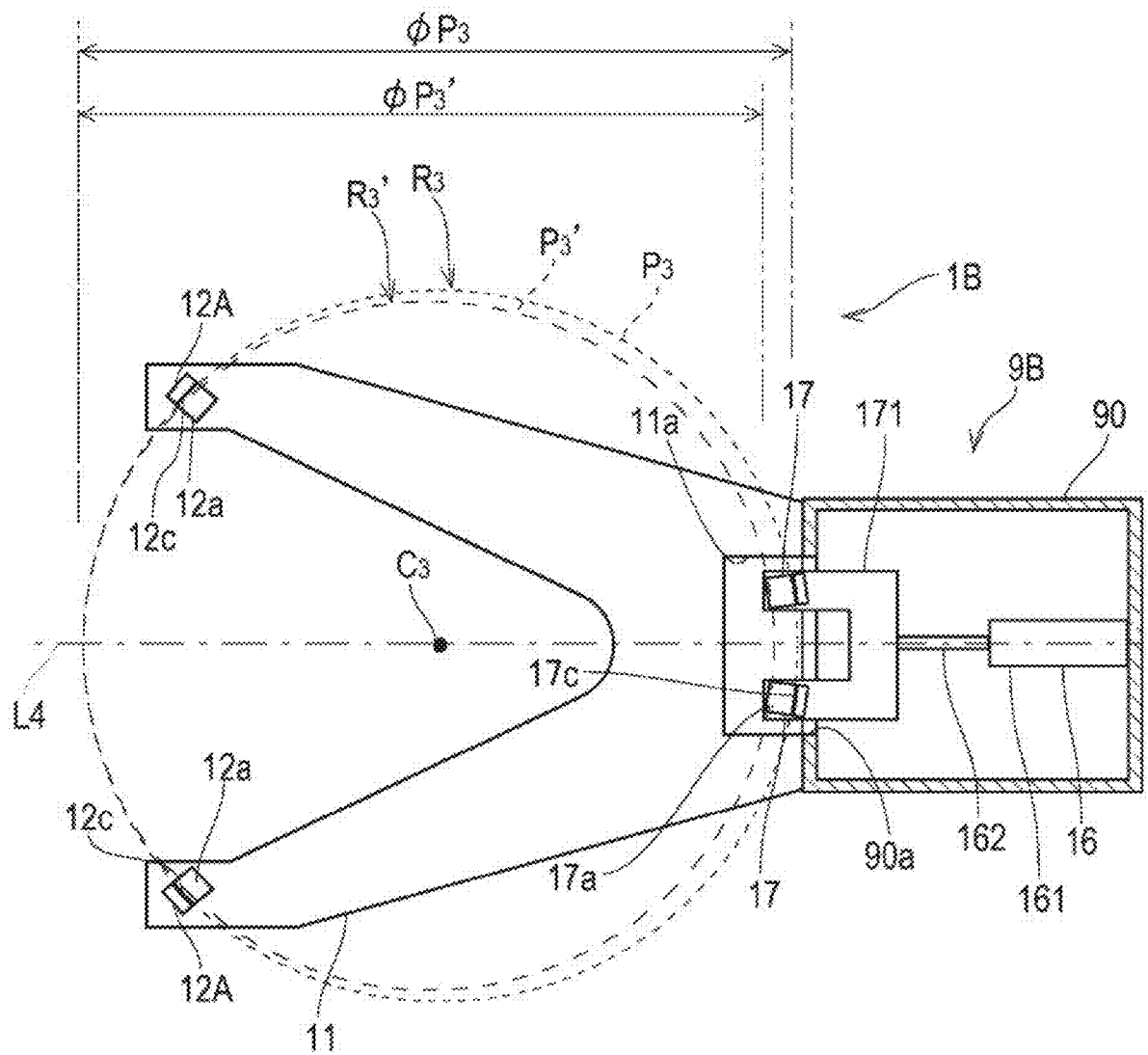
FIG. 12 is a plan view of a substrate holding hand according to Modification 2.
Figure 13:
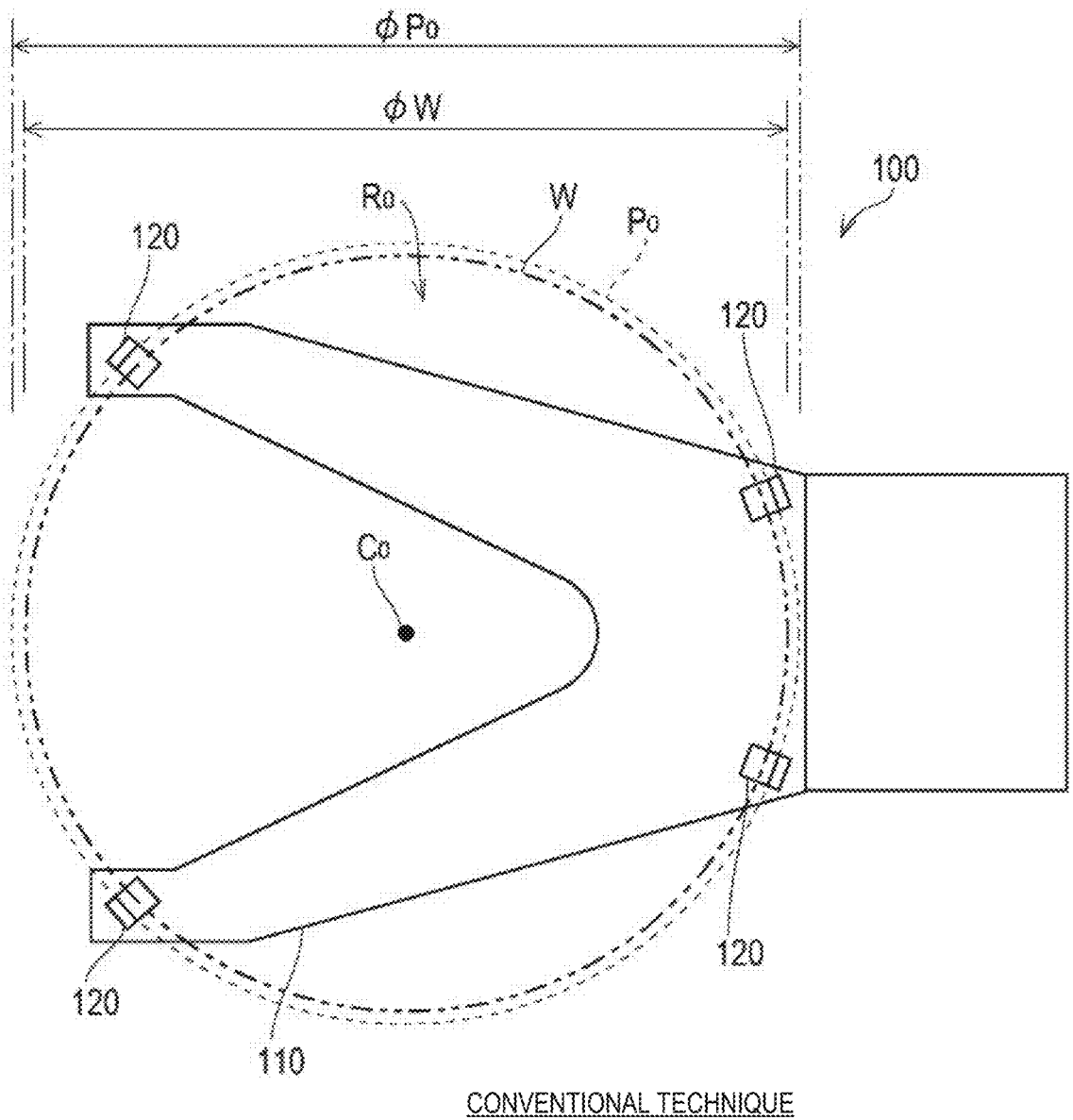
FIG. 13 is a plan view of a conventional substrate holding hand in a placing mode.

Although the substrate holding hand 1A according to Modification 1 is provided with the first rear support block 13 fixed to the supporting plate 11, the first rear support block 13 may be omitted. FIG. 12 is a plan view of a substrate holding hand 1B according to Modification 2. The substrate holding hand 1B illustrated in FIG. 12 is provided, instead of the first rear support block 13 and the first movable stopper 23 of the substrate holding hand 1A according to Modification 1, with movable support blocks 17 which are provided with a combination of these functions.

The pair of movable support blocks 17 are attached to a support member 171. The support member 171 is a channel-shaped member in which a tip-end part is branched into two, and the movable support blocks 17 are provided to the respective two-branched tip-end parts. The support member 171 is reciprocated in parallel to the hand axis L4 by a stopper actuator 16. The stopper actuator 16 is, for example, an air cylinder 161, and the support member 171 is connected to an output end of a cylinder rod 162 of the air cylinder 161. Each movable support block 17 has a movable pad 17a and a movable stopper 17c. The movable pad 17a has an upward surface which is used as a placement surface of the substrate W. The movable stopper 17c has a surface perpendicular to the principal surface of the supporting plate 11.

In the hand 1, a circular third capture range $R_3$ centering on a given third supporting plate center $C_3$ is defined. A diameter $\varphi P_3$ of an outer circumferential circle $P_3$ of the third capture range $R_3$ is slightly (about several millimeters)

larger than a diameter φW of the substrate W. Along the outer circumferential circle $P_3$ of the third capture range $R_3$, the pair of first front stoppers 12c and the pair of movable stoppers 17c are disposed. The movable pads 17a are located inside the third capture range $R_3$. Each of the stoppers 12c and 17c faces substantially toward the third supporting plate center $C_3$.

When the pair of movable stoppers 17c are moved to a given deployed position toward the hand tip end by operation of the stopper actuator 16, the third capture range $R_3$ is reduced to a reduced third capture range $R_3'$. Similarly to the third capture range $R_3$, the reduced third capture range $R_3'$ is formed by the pair of first front stoppers 12c and the pair of movable stoppers 17c. A diameter $\varphi P_3'$ of an outer circumferential circle $P_3'$ of the reduced third capture range $R_3'$ is larger than the diameter φW of the substrate W and smaller than the diameter $\varphi P_3$ of the outer circumferential circle $P_3$ of the third capture range $R_3$ ({the diameter of the substrate W}$\varphi W < \varphi P_3' < \varphi P_3$).

As described above, in the hand 1B according to Modification 2, the movable pad 17a is provided to the movable stopper 17c. This movable pad 17a is provided to the hand tip-end side of the movable stopper 17c, and integrally operates with the movable stopper 17c. When the movable stopper 17c is located at the retracted position, the movable stopper 17c is located on the outer circumferential circle $P_3$ of the capture range $R_3$, and the movable pad 17a is located inside the capture range $R_3$. When the movable stopper 17c is located at the deployed position, at least a part of the movable stopper 17c is located inside the capture range $R_3$, and the movable pad 17a is located inside the capture range $R_3$. Thus, in the hand 1B according to Modification 2, the member which defines the hand base-end side part of the third capture range $R_3$, and the member which defines the hand base-end side part of the reduced third capture range $R_3'$ are realized by the same movable stopper 17c.

DESCRIPTION OF REFERENCE CHARACTERS 1, 1A, 1B: Substrate Holding Hand
2: Substrate Transferring Robot
4: Arm
8: Control Device
11: Supporting Plate
12a, 12b: Front Pad
12c, 12d: Front Stopper (Stationary Stopper)
13a, 14a, 17a: Rear Pad
13c, 14c: Rear Stopper
16, 25, 26: Stopper Actuator
17c, 23, 24: Movable Stopper
31, 32: Presence Sensor
$R_1$, $R_2$, $R_3$: Reference Capture Range
$R_1'$, $R_2'$, $R_3'$: Reduced Capture Range
$U_1$, $U_2$: Support Unit
W: Substrate

What is claimed is:

1. A substrate holding hand, comprising:
   a supporting plate where a circular reference capture range is defined;
   a pair of front support blocks, each front support block including:
      a plurality of pads disposed on the supporting plate within the reference capture range;
      a pair of front stoppers disposed along an outer circumferential circle of the reference capture range, and regulates movement of a substrate supported by the plurality of pads to the outer circumference side of the reference capture range;
   at least one movable stopper having a part at the same height from the supporting plate as the pair of front stoppers of each of the pair of front support blocks; and
   a stopper actuator that moves the at least one movable stopper from a retracted position on or outside the outer circumferential circle of the reference capture range to a deployed position closer to the pair of front stoppers of each of the pair of front support blocks stationary stopper from the retracted position,
   wherein the substrate is not gripped by the pair of front stoppers or the at least one movable stopper while the substrate is mounted to the pair of front support blocks and to the at least one movable stopper and while the at least one movable stopper is in a deployed position,
   wherein a circular reduced capture range is defined by the at least one movable stopper at the deployed position and the front stoppers of the pair of front support blocks, and
   wherein a diameter of the reduced capture range is larger than a diameter of the substrate and smaller than a diameter of the reference capture range.

2. The substrate holding hand of claim 1, further comprising:
   control circuitry configured to control the stopper actuator,
   wherein the control circuitry controls the stopper actuator so that the at least one movable stopper moves from the retracted position to the deployed position at a given timing after the substrate is placed on the plurality of pads.

3. The substrate holding hand of claim 1, further comprising:
   control circuitry configured to control the stopper actuator; and
   a sensor that detects the existence of the substrate placed on the plurality of pads,
   wherein the control circuitry controls the stopper actuator so that the at least one movable stopper moves from the retracted position to the deployed position at a given timing after the sensor detects that the substrate is placed on the plurality of pads.

4. The substrate holding hand of claim 1, further comprising at least one rear stopper that is disposed in a base-end part of the supporting plate, along the outer circumferential circle of the reference capture range, and regulates movement of the substrate supported by the plurality of pads to the base-end part side.

5. The substrate holding hand of claim 1, further comprising a movable pad that is provided to a tip-end side of the at least one movable stopper, and operates integrally with the at least one movable stopper,
   wherein, when the at least one movable stopper is located at the retracted position, the at least one movable stopper is located on the outer circumferential circle of the reference capture range, and the movable pad is located inside the reference capture range.

6. The substrate holding hand of claim 1, wherein a plurality of reference capture ranges are defined in the supporting plate, the plurality of reference capture ranges being a first reference capture range, and a second reference capture range shifted from the first reference capture range to the tip-end side,
   wherein, for the first reference capture range, a first step support unit including a combination of the plurality of pads, the pair of front stoppers of each of the pair of front support blocks, the at least one movable stopper, and the stopper actuator is provided, and
wherein, for the second reference capture range, a second step support unit including a combination of the plurality of pads, the pair of front stoppers of each of the pair of front support blocks, the at least one movable stopper, and the stopper actuator is provided, the second step support unit supporting the substrate at a higher position from the supporting plate than the first step support unit.

7. A substrate transferring robot, comprising:
an arm; and
the substrate holding hand of claim 1, attached to a tip-end part of the arm.

8. The substrate holding hand of claim 1, wherein the stopper actuator includes an air cylinder and a control valve.

9. The substrate holding hand of claim 8, wherein the air cylinder includes a cylinder rod, and
wherein the at least one movable stopper is connected to the cylinder rod of the air cylinder.

10. The substrate holding hand of claim 1, further comprising:
a casing;
a pair of first rear support blocks; and
a pair of second rear support blocks,
wherein in the retracted position of the at least one movable stopper, the at least one movable stopper is disposed in the casing, and
wherein in a retracted position of the second rear support blocks, the pair of second rear support blocks are disposed in the casing.

11. The substrate holding hand of claim 10, further comprising:
a support member having first branch and a second branch,
wherein the first branch supports one second rear support block among the pair of second rear support blocks, and
wherein the second branch supports an other second rear support block among the pair of second rear support blocks.

12. The substrate holding hand of claim 11, further comprising:
a block actuator for moving the support member, the block actuator including an air cylinder and a control valve, the air cylinder including a cylinder rod,
wherein the support member is connected to the cylinder rod.

13. The substrate holding hand of claim 10, wherein each second rear support block includes:
a rear pad; and
a rear stopper in the form of a vertical surface, the rear stopper being disposed between the rear pad and a step of the second rear support block.

14. The substrate holding hand of claim 13, wherein the rear pad of the pair of second rear support blocks has a downward slope towards the supporting plate.

15. The substrate holding hand of claim 10, wherein the pair of first rear support blocks are disposed outside of the casing, and
wherein each first rear support block includes:
a rear pad; and
a rear stopper in the form of a vertical surface disposed between the rear pad and a step of the first rear support block.

16. The substrate holding hand of claim 1, wherein each front support block includes:
a first front pad among the plurality of pads, the first front pad being formed in a first step from a bottom of the front support block; and
a second front pad among the plurality of pads.

17. The substrate holding hand of claim 16, wherein the first front pad is disposed below the second front pad relative to the supporting plate, and
wherein the first front pad and the second front pad have a downward slope towards the supporting plate.

18. The substrate holding hand of claim 16, wherein the first front pad is disposed closer to the supporting plate than the second front pad.

19. The substrate holding hand of claim 18, wherein for each of the front support blocks, the pair of front stoppers includes a first front stopper in the form of a vertical surface disposed between the first front pad and the second front pad.

20. The substrate holding hand of claim 19, wherein for each of the front support blocks, the pair of front stoppers further includes a second front stopper in the form of a vertical surface disposed between the second front pad and a top step of the front support block.

* * * * *